United States Patent
Li et al.

(10) Patent No.: US 10,996,365 B2
(45) Date of Patent: May 4, 2021

(54) RF FLIP ANGLE ADJUSTMENT IN A DOWNHOLE NMR TOOL

(71) Applicant: Halliburton Energy Services, Inc., Houston, TX (US)

(72) Inventors: Lilong Li, Humble, TX (US); Arcady Reidermann, Katy, TX (US); David R. Beard, Houston, TX (US); Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 218 days.

(21) Appl. No.: 16/077,652

(22) PCT Filed: Sep. 29, 2016

(86) PCT No.: PCT/US2016/054443
§ 371 (c)(1),
(2) Date: Aug. 13, 2018

(87) PCT Pub. No.: WO2018/063246
PCT Pub. Date: Apr. 5, 2018

(65) Prior Publication Data
US 2019/0049615 A1 Feb. 14, 2019

(51) Int. Cl.
*G01V 3/26* (2006.01)
*G01V 3/32* (2006.01)
(Continued)

(52) U.S. Cl.
CPC .............. *G01V 3/26* (2013.01); *E21B 47/003* (2020.05); *E21B 47/13* (2020.05); *G01N 24/081* (2013.01);
(Continued)

(58) Field of Classification Search
CPC ... G01V 3/26; G01V 3/32; G01V 3/34; G01V 2210/6167; E21B 47/003; E21B 47/13;
(Continued)

(56) References Cited

U.S. PATENT DOCUMENTS 6,411,087 B1 * 6/2002 Fan ...................... G01N 24/081
324/300
6,577,125 B2  6/2003 Prammer et al.
(Continued)

FOREIGN PATENT DOCUMENTS

WO    WO-2016019247 A1    2/2016

OTHER PUBLICATIONS

International Search Report and Written Opinion for PCT Application No. PCT/US2016/054443, dated Jun. 23, 2017.

*Primary Examiner* — Raymond L Nimox
(74) *Attorney, Agent, or Firm* — Locke Lord LLP (57) ABSTRACT

A logging instrument for estimating a property of a formation is provided. The instrument includes a magnet to generate a magnetic field. The instrument also includes pulse sequencer circuitry that supplies radio frequency (RF) signals. The instrument additionally includes an antenna system configured to transmit the RF signals and to obtain nuclear magnetic resonance (NMR) measurements of the formation in response to the transmitted RF signals. In one aspect, the logging tool contains a temperature sensor configured to obtain temperature measurements of the magnet. The instrument additionally includes a control unit communicatively coupled to the temperature sensor, the antenna system and the pulse sequencer circuitry and configured to receive the temperature measurements and selectively adjust operating parameters of the pulse sequencer circuitry based on the received temperature measurements in order to maintain optimal intensity of the magnetic field.

14 Claims, 7 Drawing Sheets

(51) Int. Cl.
*G01V 3/34* (2006.01)
*G01R 33/38* (2006.01)
*G01N 24/08* (2006.01)
*G01R 33/58* (2006.01)
*E21B 47/003* (2012.01)
*E21B 47/13* (2012.01)

(52) U.S. Cl.
CPC ....... *G01R 33/3804* (2013.01); *G01R 33/583* (2013.01); *G01V 3/32* (2013.01); *G01V 3/34* (2013.01); *G01V 2210/6167* (2013.01)

(58) Field of Classification Search
CPC . G01N 24/081; G01R 33/3804; G01R 33/583
See application file for complete search history.

(56) References Cited

U.S. PATENT DOCUMENTS

| | | | |
|---|---|---|---|
| 6,803,761 | B2 | 10/2004 | Prammer et al. |
| 2005/0030021 | A1* | 2/2005 | Prammer ................. G01V 3/32 324/303 |
| 2005/0156592 | A1* | 7/2005 | Bordon .............. G01R 33/3628 324/303 |
| 2009/0058416 | A1* | 3/2009 | Blanz ...................... G01V 3/32 324/303 |
| 2009/0121711 | A1 | 5/2009 | Blanz |
| 2009/0128144 | A1 | 5/2009 | Freedman et al. |
| 2013/0093422 | A1* | 4/2013 | Morys ..................... H01Q 7/00 324/303 |
| 2013/0285652 | A1 | 10/2013 | Rudakov et al. |
| 2014/0253116 | A1 | 9/2014 | Freedman et al. |
| 2017/0176627 | A1* | 6/2017 | Venkataramanan ..... G01V 3/32 |
| 2017/0315257 | A1* | 11/2017 | Coman ................... G01V 3/32 |

* cited by examiner

RF FLIP ANGLE ADJUSTMENT IN A DOWNHOLE NMR TOOL

CROSS REFERENCE TO RELATED APPLICATIONS

This application is the U.S. National Stage of PCT International Application No. PCT/US2016/054443, filed Sep. 29, 2016, the entire disclosure of which is hereby incorporated herein by reference in its entirety.

TECHNICAL FIELD OF THE INVENTION

The embodiments disclosed herein generally relate to downhole measurements and, more particularly, to Radio Frequency (RF) flip angle adjustment in a downhole Nuclear Magnetic Resonance tool.

BACKGROUND OF THE INVENTION

Performing downhole measurements is desirable in many oil industry applications. Various methods exist for performing downhole measurements of petrophysical parameters of a geologic formation. Nuclear magnetic resonance (NMR) logging is among the most important methods that have been developed for rapid determination of such parameters, including formation porosity, composition of formation fluid, quantity of movable fluid, permeability and others.

Wireline logging of earth formation performed using NMR tools or other techniques known in the art provides valuable information concerning the petrophysical properties of the formation and, in particular, regarding the fluid composition of the formation. However, various challenges exist with respect to the use of tuned NMR tools in wireline logging. For example, there is variation of the magnetic field with temperature. A magnetic field's strength, in part, is characterized by its remnant flux density (Br). Magnetic field's remnant flux is temperature dependent. It should be understood that the precise temperature coefficient of Br depends on the particular magnet used in the NMR tool. For example, it is known that samarium cobalt magnets have a temperature coefficient of Br of approximately −0.035%, but can be as high as −0.05% depending on composition of the material. Thus, a 100° C. temperature difference can cause a substantial 5% change in the magnetic field intensity. Left uncompensated, changes in temperature degrade instrument performance.

The ability to mitigate the effects of magnetic field intensity variation is of direct relevance to NMR logging, particularly for real-time processing integrated as a workflow. Accordingly, there is continued interest in the development of improved NMR tools.

BRIEF DESCRIPTION OF THE SEVERAL VIEWS OF THE DRAWING

For a more complete understanding of the disclosed embodiments, and for further advantages thereof, reference is now made to the following description taken in conjunction with the accompanying drawings in which.

DETAILED DESCRIPTION OF THE DISCLOSED EMBODIMENTS

The following discussion is presented to enable a person skilled in the art to make and use the invention. Various modifications will be readily apparent to those skilled in the art, and the general principles described herein may be applied to embodiments and applications other than those detailed below without departing from the spirit and scope of the disclosed embodiments as defined herein. The disclosed embodiments are not intended to be limited to the particular embodiments shown, but are to be accorded the widest scope consistent with the principles and features disclosed herein.

The term "uphole" as used herein means along the drill string or the hole from the distal end towards the surface, and "downhole" as used herein means along the drill string or the hole from the surface towards the distal end.

It will be understood that the term "oil well drilling equipment" or "oil well drilling system" is not intended to limit the use of the equipment and processes described with those terms to drilling an oil well. The terms also encompass drilling natural gas wells or hydrocarbon wells in general. Further, such wells can be used for production, monitoring, or injection in relation to the recovery of hydrocarbons or other materials from the subsurface. This could also include geothermal wells intended to provide a source of heat energy instead of hydrocarbons.

In general, NMR measurement involves generating a static magnetic field within a sample volume, emitting RF electromagnetic pulses into the sample volume, and detecting RF NMR responses from the sample volume. Most commonly, NMR measurement involves emitting multiple RF pulses in rapid succession and measuring the RF NMR responses between the RF pulses. The measured RF NMR responses provide useful information about the sample volume.

As noted above, the magnetic field's remnant flux is temperature dependent. One solution to eliminate or minimize any magnetic field intensity variation over the working range of temperatures is to use a magnetic material with almost zero Br temperature coefficients. Alternatively, magnetic materials with positive and negative temperature coefficients can be used to collectively cancel out temperature effect on the magnetic field's intensity.

However, magnet assemblies of NMR tools often include permeable (soft) magnetic pieces in addition to the permanent magnet. The soft magnetic material typically also has at least one magnetic property which varies in a predetermined manner over a temperature range. The temperature-dependent magnetic property may comprise, for example, magnetic susceptibility, magnetic permeability, magnetic remanence, or any combination of these and other related magnetic properties. A magnetic flux in the core is proportional to the magnetic permeability of the material. Thus, a change of magnetic permeability of the core material has at least two effects. First, this change leads to changes in the magnetic field distribution also changing the static magnetic field intensity. Second, a change of magnetic permeability of the core leads to changes in the sensitivity of the antenna disposed in the NMR tools also proportionally changing corresponding RF electromagnetic pulse signals. In other words, temperature-dependent changed magnetic permeability of the permanent magnet and the core material collectively degrade signal quality, which is usually quantified by Signal-to-Noise Ratio (SNR).

Embodiments disclosed here integrate the concepts of changing the flipping angle of RF excitation and refocusing RF pulses into NMR measurements to mitigate the effects of magnetic field intensity variation and the antenna sensitivity variation. To facilitate a better understanding of the present disclosure, the following examples of certain embodiments are given. In no way should the following examples be read to limit, or define, the scope of the disclosure. Embodiments of the present disclosure and its advantages are best understood by referring to FIGS. 1A-1C and FIGS. 2 through 5, where like numbers are used to indicate like and corresponding parts.

Embodiments of the present disclosure may be applicable to horizontal, vertical, deviated, multilateral, u-tube connection, intersection, bypass (drill around a mid-depth stuck fish and back into the wellbore below), or otherwise nonlinear wellbores in any type of subterranean formation. Certain embodiments may be applicable, for example, to logging data acquired with wireline, slickline, and logging while drilling/measurement while drilling (LWD/MWD). Certain embodiments may be applicable to subsea and/or deep sea wellbores. Embodiments described below with respect to one implementation are not intended to be limiting.

Figure 1A:
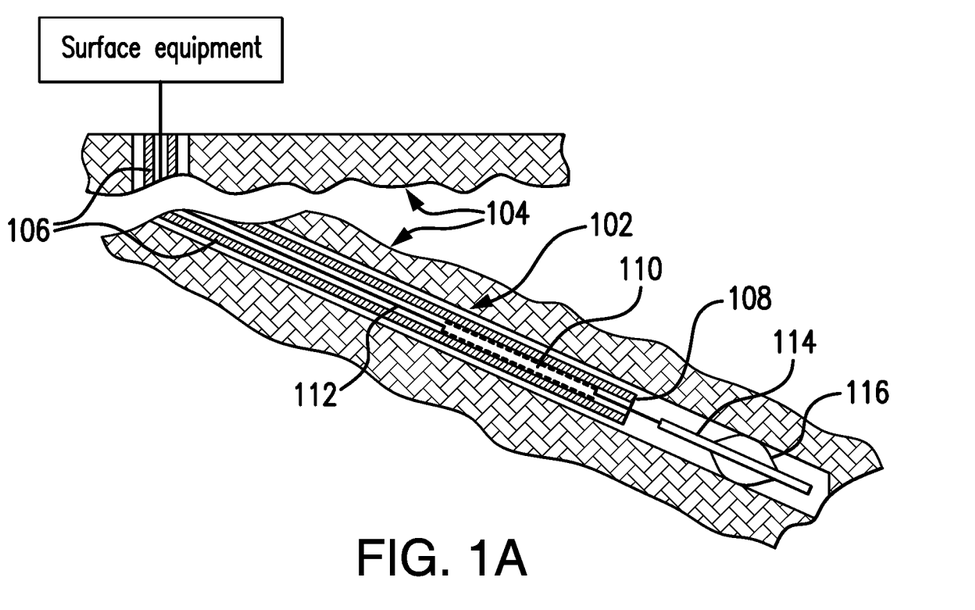
FIG. 1A shows a schematic diagram illustrating an exemplary embodiment of a logging instrument used in pipe assisted wireline application.

Turning now to the drawings, FIG. 1A shows a borehole 102 drilled into a geological formation 104 to be investigated for potential hydrocarbon producing reservoirs. A drill string 106 extends from a drilling rig (not shown) into the borehole 102 whereby the open lower end 108 is disposed in the open lower borehole portion. An NMR logging tool capable of being lowered or raised through the drill string 106 is suspended in the drill string 106 using a wireline cable 112 deployment. The tool is typically lowered down the drill string and "pumped" out of drill pipe into open hole. The NMR logging tool in the open hole position is shown at 114. The tool 114 has a retractable bow spring centralizer 116. Instead of the bow spring, the tool 114 may have retractable arms or a "car jack" type centralizer. The tool 114 may be powered by a battery (not shown) and can be provided with an electronic memory (shown in FIG. 1C) or other recording medium for storing measurement data.

It is to be clearly understood that the embodiment of the logging tool shown in FIG. 1A is only an example. It is within the scope of various embodiments to include different modes of operation: a wireline, including through the bit conveyance (out through the pipe end or through the bit) or memory mode (hanging the tool of the pipe end or off the bit and logging while tripping pipe). In both cases the tool may be lowered on wireline, by pumping down, or a combination of the two.

Figure 1B:
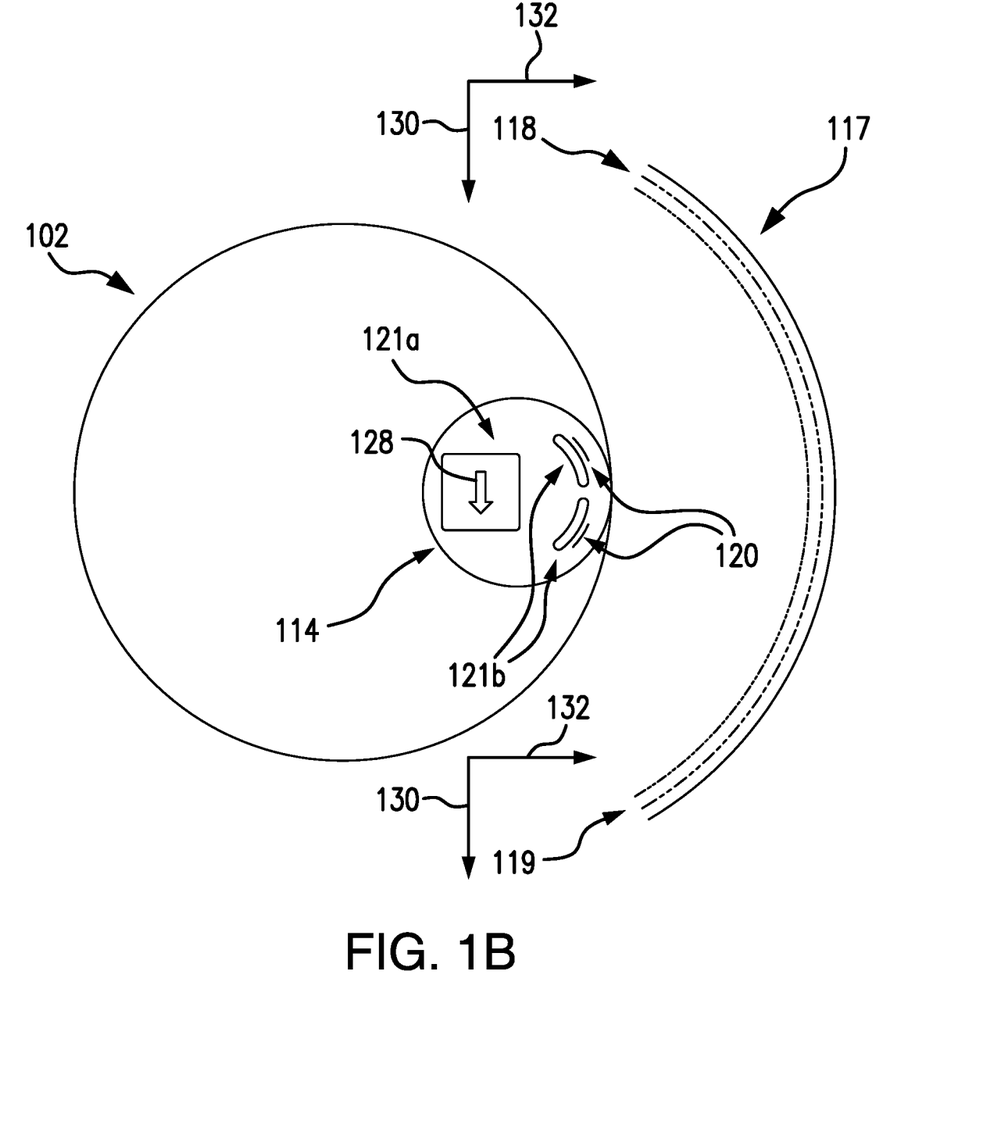
FIG. 1B shows a schematic diagram with a cross sectional view of an exemplary embodiment of an assembly used for NMR well logging measurement.

Turning now to FIG. 1B, where a cross-sectional view (along the plane perpendicular to the borehole axis) of the NMR logging tool 114 is presented. According to an embodiment of the present invention, the logging tool 114 described in greater detail below includes a permanent magnet 121a and an antenna system 120. Magnetization direction 128 of the permanent magnet 121a is perpendicular to the axis of the tool 114, wherein the axis if the tool 114 is parallel to the axis of the borehole 102. A static magnetic field 130 and a radio-frequency magnetic field 132 are mutually orthogonal and ideally should have a substantially constant magnitude at the volume of investigation.

FIG. 1B also shows sensitive volume changes for a certain RF signal due to temperature variations. For example, a first curved line segment 117 diagrammatically represents the subterranean region (sensitive volume) affected by the radio-frequency magnetic field 132 at low temperatures. A second curved line segment 118 diagrammatically represents the subterranean region affected by the radio-frequency magnetic field 132 for the same frequency at high temperatures due to temperature dependence of Br of the permanent magnet 121a. A third curved line segment 119 diagrammatically represents the subterranean region affected by the radio-frequency magnetic field 132 for the same frequency at high temperatures due to temperature dependence of Br of the permanent magnet 121a and the magnetic permeability of the soft magnetic core(s) 121b described below.

Figure 1C:
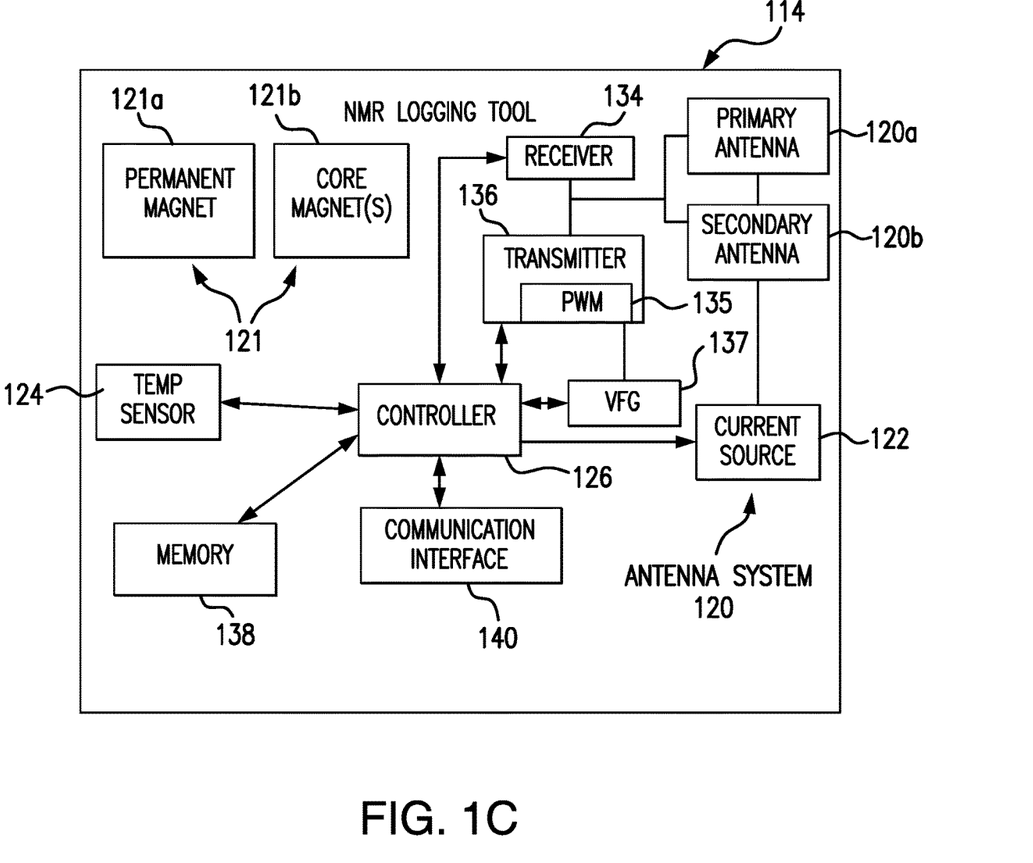
FIG. 1C shows a block diagram of an example NMR logging tool in accordance with one embodiment of the present disclosure.

The example NMR logging tool 114 shown in FIG. 1C includes an antenna system 120, a permanent magnet 121a and one or more core magnetic pieces 121b, a current source 122, a temperature sensor 124, a controller 126, a receiver 134, a transmitter 136, a variable frequency generator (VFG) 137, a memory 138, and a communication interface 140. In various embodiments, the NMR logging tool 114 may include additional or different features (e.g., a gradient system, etc.), and the features of the NMR logging tool 114 may be configured as shown in FIG. 1C or in another manner.

The example principal magnet system 121 can include multiple permanent magnets 121a and soft magnetic core piece(s) 121b made of a non-conductive material adapted to create a magnetic field about the NMR logging tool 114. Any suitable type and size of permanent magnet may be used. However, in one embodiment, one or more permanent magnet(s) 121a may comprise a Samarium Cobalt (SmCo) permanent magnet about 3 inches in diameter. In the example NMR logging tool 114 shown in FIG. 1C, the soft magnetic cores 121b can be used to increase efficiency of the antenna system 120. Core 121b is preferably comprised of the preferred powdered soft magnetic material such as the commercially available MICROMETALS™ or FLUX-TROL™ iron powder materials and preferably comprises a ferromagnetic metal powder combined with an organic non-conductive binder, such as an epoxy resin. The principal magnet system 121 can produce a static magnetic field that is designed to polarize nuclear spins in a volume of a subterranean formation, such as volume 117 about the borehole 102 (shown in FIG. 1B). In embodiments of the present invention, the static magnetic field generated by the principal magnet system 121 has substantially the same strength over a region of interest.

The example transmitter 136 can generate and send an RF drive signal to the antenna system 120. The transmitter 136 can receive input data from the controller 126, the memory 138, or another source. In one embodiment, the RF drive signal generated by the transmitter 136 includes a pulse sequence applied by the antenna system 120. Further, in one embodiment, the example transmitter includes a Pulse Width Modulator (PWM) 135 to modulate the width of the RF pulse sequence. The PWM 135 can be implemented by conventional comparator integrated circuits as explained in U.S. patent application Ser. No. 12/127,126 filed on May 27, 2008, by C. Bryant for "Pulse-Width Modulator Methods and Apparatus."

The example receiver 134 can receive the RF detection signal from the antenna system 120. The receiver 134 can provide the received RF detection signal to the controller 126, the memory 138, the communication interface 140, or to another component. In some cases, the receiver 134 can digitize or preprocess the RF detection signal from the antenna system 120.

The example antenna system 120 can receive the RF drive signal from the transmitter 136 and generate an RF magnetic field 132 (shown in FIG. 1B) about the NMR logging tool 114. The RF magnetic field 132 generated by the antenna system 120 can be, for example, an RF pulse that manipulates the direction of polarization of nuclear spins in a region of interest about the borehole 102. The antenna system 120 can receive a current from a current source 122 and produce an RF dipole field based on the current. In an embodiment, the current source 122 may comprise an alternating current source. When collecting NMR data, the antenna system 120 magnetically couples with the nuclear spins in the subterranean region, which produces an RF detection signal on the antennas. The antenna system 120 can output the detection signal to the receiver 134. The example antenna system 120 shown in FIG. 1C includes a primary antenna 120a, and a secondary antenna 120b. The antenna system 120 may include additional or different features, and the features of the antenna system 120 can be arranged as shown in FIG. 1C or in another manner. The primary and secondary antennas can be structurally identical, or different antenna structures can be used. In some embodiments, the antenna system 120 includes more than two antennas.

According to an embodiment of the present invention, the temperature sensor 124 is provided in the NMR logging tool 114 to enable the temperature conditions within the borehole 102 to be monitored. According to various embodiments, the integrated temperature sensor 124 may comprise either an analog or digital temperature sensor. In one embodiment, a digital temperature sensor 124 may further comprise a digital filter feature which enables a user to control the temperature sensor sensitivity. According to various embodiments, a variety of such filters may be implemented. The temperature sensor 124 may be configurable, for example comprising a configuration register which can be configured through the controller 126.

The example controller 126 can control operation of the logging tool 114. For example, as described in greater detail below, the controller 126 can control the transmitter 136 and the receiver 134 to control/adjust pulse sequences applied by the antenna system 120, and to control the detection of NMR signals by the antenna system 120. The controller 126 can be, for example, a digital electronic controller, a programmable microprocessor, or any other type of data processing apparatus.

The example memory 138 can include any type of data storage, computer memory, or another type of computer-readable medium. In some embodiments, the memory 138 can store machine-readable instructions that are executed by the controller 126 to operate the NMR logging tool 114. In some embodiments, the memory 138 can store a pulse program that specifies one or more pulse sequences to be applied by the antenna system 120. The memory 138 may store NMR data acquired by the NMR logging tool 114. For example, the memory 138 may store NMR logging data obtained from a subterranean region. The memory 138 may store additional or different types of data.

The example communication interface 140 allows the NMR logging tool 114 to interface with other tools, systems, or communication links. In some embodiments, the communication interface 140 includes a data port that allows pulse sequences to be loaded into the memory 138 or programmed into the controller 126. In some embodiments, the communication interface 140 includes a data port that allows NMR logging data to be communicated from the NMR logging tool 114 to an external computing system or database. In some instances, the communication interface 140 transmits NMR logging data from the NMR logging tool 114 while the NMR logging tool 114 is disposed within a borehole in a subterranean formation. For example, the NMR logging data may be transmitted to a computing system or another destination at the surface.

Figure 2:
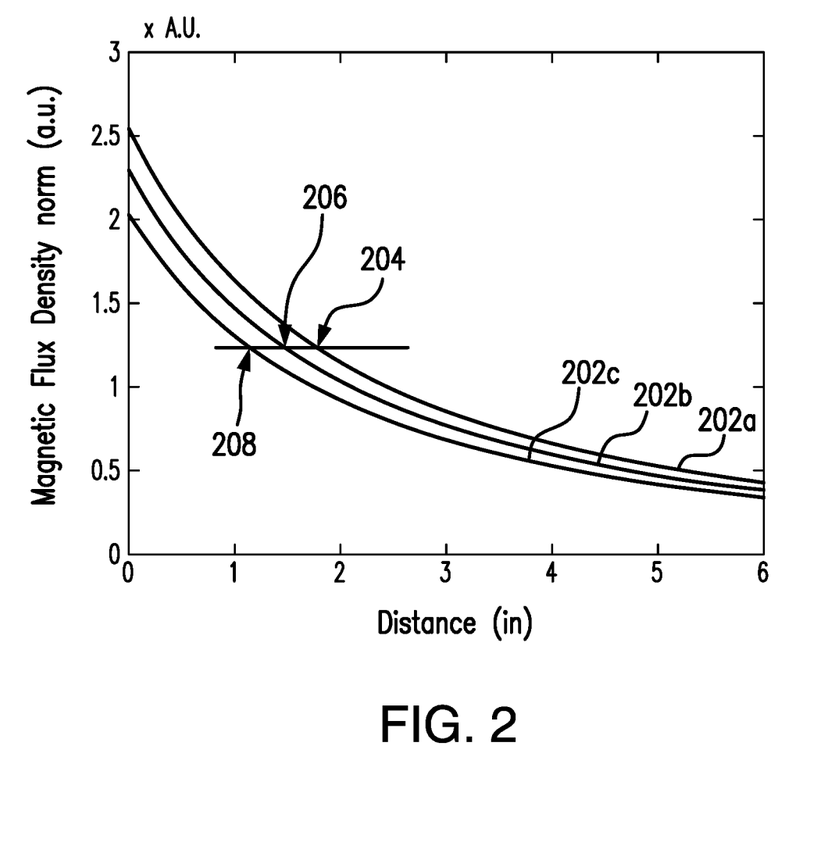
FIG. 2 shows graphs illustrating the move of sensitive volume as a result of change in temperature.

FIG. 2 shows a graph illustrating the move of sensitive volume as a result of change in temperature. In FIG. 2 the horizontal axis indicates the distance (inches) of the sensitive volume from the NMR logging tool 114 and the vertical axis corresponds to the magnetic flux density (B). Generally, when temperature is raised, due to the usually negative temperature coefficient of Br, the magnetic field intensity is lowered. First curve 202a shows a relationship between the sensitive volume's distance from the NMR logging tool and the magnetic flux density at low temperature. Second curve 202b in FIG. 2 shows a relationship between the sensitive volume's distance from the NMR logging tool and the magnetic flux density when Br changes. In addition, the magnetic permeability of certain magnetic materials used in the soft magnetic core 121b will get higher at higher temperature causing the field intensity to get even lower. Third curve 202c shows a relationship between the distance and the magnetic flux density when both the Br and the permeability of the core material 121b change. Curves 202a-202c illustrate how, at a substantially constant magnitude of magnetic flux density at low temperature, the original distance (i.e., at point 204) is reduced (i.e., at point 206) at a high temperature when Br changes and is reduced even more (i.e., at point 208) when the permeability of the core material changes as well. In other words, as shown in FIGS. 1B and 2, when RF pulses are applied to a subterranean region (sensitive volume) of interest using a pre-selected RF frequency corresponding to a certain magnetic field strength, the sensitive volume will gradually shift to lower depth as temperature rises.

Figure 3:
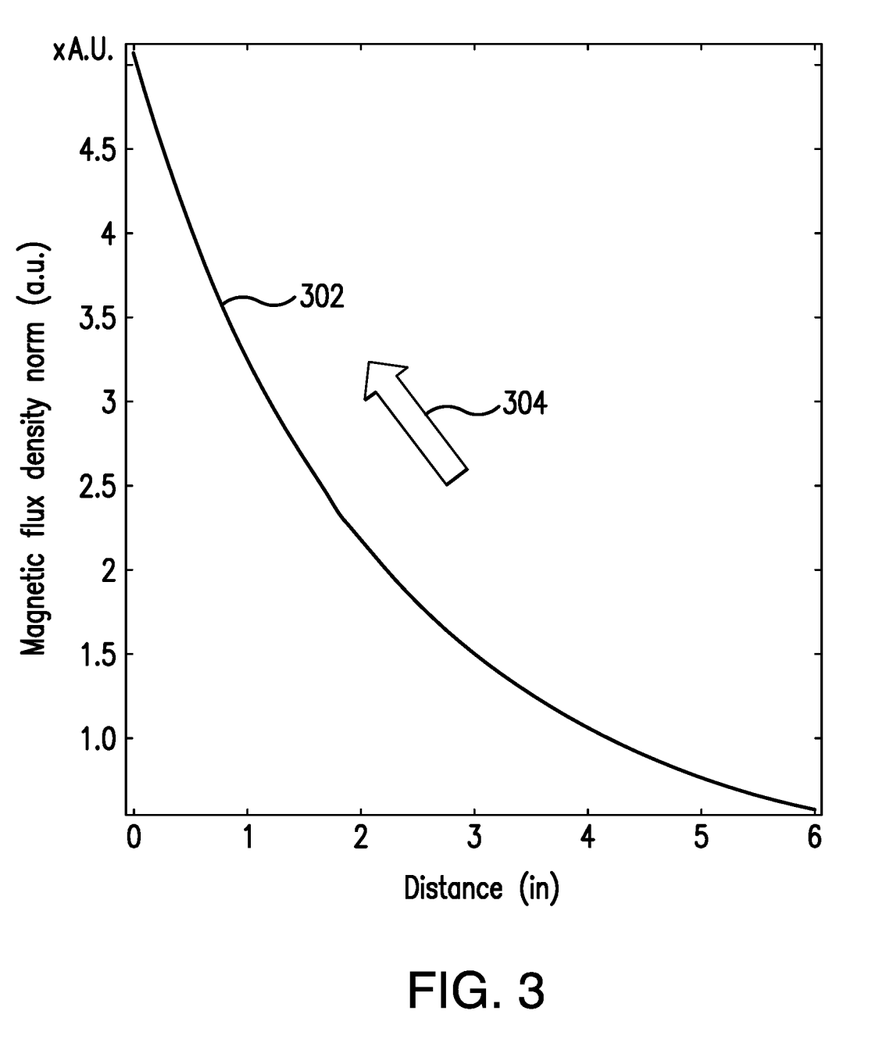
FIG. 3 shows a graph associated with a B1 field decay curve in a region of interest as sensitive volume moves away from the NMR logging tool.

FIG. 3 illustrates a graph associated with a B1 field decay curve in the region of interest as sensitive volume moves away from the NMR tool 114. In FIG. 3 the horizontal axis indicates the distance and the vertical axis corresponds to the magnetic flux density. For accuracy of NMR logging, stability of the system is important. In one embodiment, before the beginning of the actual measurements, one or more calibration pulses may be sent by the NMR tool 114 in order to scale the current in the antenna system 120 that generates the RF magnetic field, so that optimal performance, for example the desired flip angle, is obtained. This calibration process is typically performed at lower (surface) temperatures. Curve 302 in FIG. 3 illustrates that the currently known techniques are only practical when the sensitive volume is very close to the tool, as the magnitude of the B1 field 304 decays as sensitive volume moves away from the tool. However, as the NMR logging tool 114 is moved to lower depths within the borehole 102 (as shown in FIG. 1B), at higher subterranean temperatures, the sensitive volume moves to a lower depth and the intensity of the B1 field gets higher for a given current.

Figure 4:
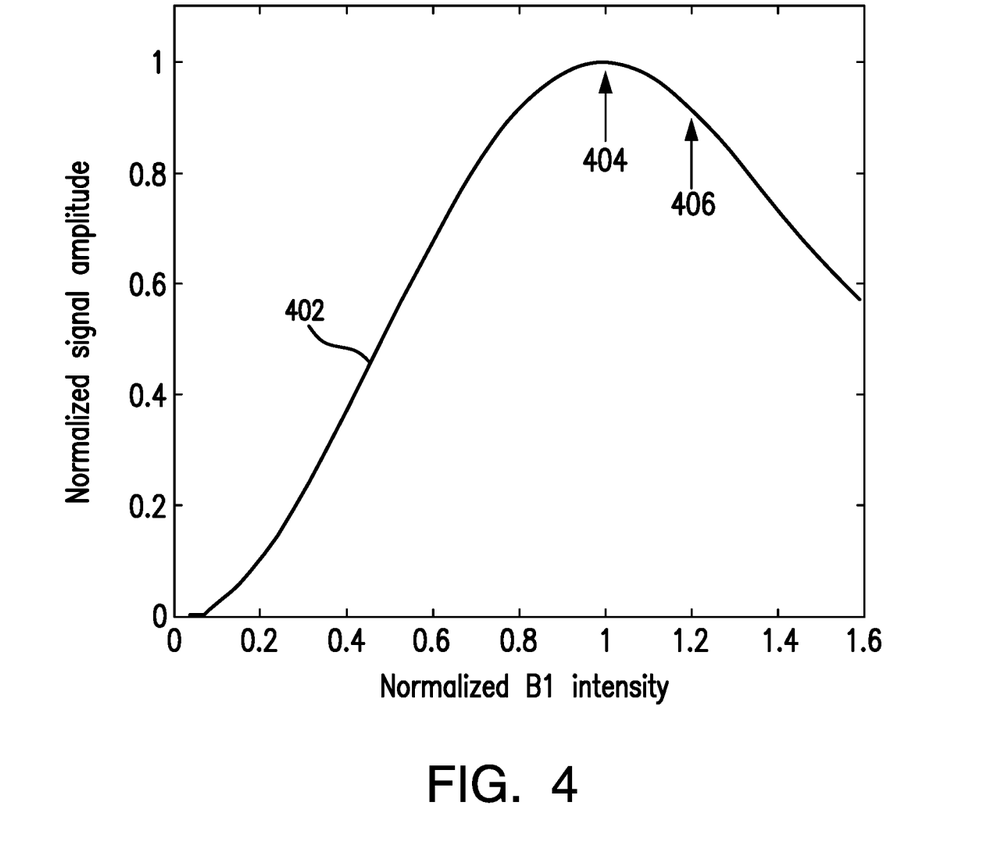
FIG. 4 shows a graph of a conventional RF signal amplitude versus normalized B1 intensity function.

FIG. 4 is a graph 402 of conventional RF signal amplitude versus normalized B1 intensity function. During a calibration process, amplitude of RF signals is adjusted so that optimal flip angle 404 is obtained. However, as explained above, at lower depth, the intensity of the B1 field gets higher for a given current amplitude. The graph 402 further illustrates that the higher than optimal B1 field causes so called "over-flipping" which leads to reduced signal amplitude 406 and reduced SNR values as compared to optimal flip angle 404. As noted above, the higher RF magnetic field intensity at higher temperatures can be caused by movement of the sensitive volume. In addition, the higher B1 field can be caused by a change of magnetic permeability of the core material at higher temperatures, which increases the sensitivity of the RF radiation, and causes even more over-tipping (FIG. 4).

Figure 5:
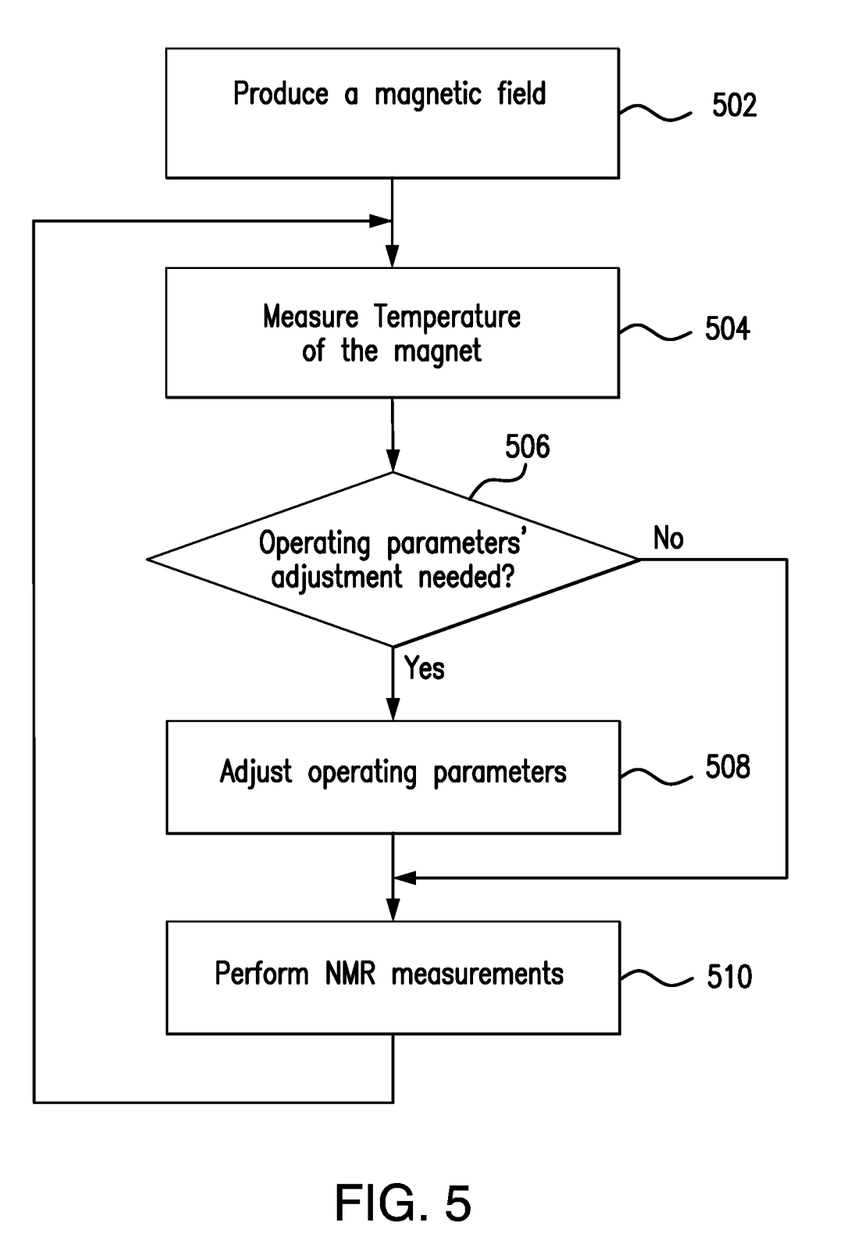
FIG. 5 shows a flow diagram depicting a process of performing NMR measurements and real-time adjustment of an NMR tool's operating parameters based on magnet assembly's temperature in accordance with one embodiment of the present disclosure.

FIG. 5 is a flow diagram depicting a process of performing NMR measurements and real-time adjustment of NMR tool's operating parameters based on magnet assembly's temperature in accordance with one embodiment of the present disclosure. Before turning to description of FIG. 5, it is noted that the flow diagram in FIG. 5 shows an example in which operational steps are carried out in a particular order, as indicated by the lines connecting the blocks, but the various steps shown in this diagram can be performed in any order, or in any combination or sub-combination. It should be appreciated that in some embodiments, some of the steps described below may be combined into a single step. In some embodiments, one or more steps may be omitted. In some embodiments, one or more additional steps may be performed. As will be appreciated by one skilled in the art, aspects of the present disclosure may be embodied as a method or computer program product. In some embodiments, the method described below may be performed, at least in part, by the controller 126 (depicted in FIG. 1C) of the NMR logging tool 114 configured to regulate operating parameters of RF signals based on the determined temperature.

According to an embodiment of the present disclosure, at step 502, once the NMR logging tool 114 is lowered to a particular desired depth within the borehole 102, the principal magnet system 121 produces a static RF magnetic field that is designed to polarize nuclear spins in a volume of a subterranean formation, such as volume 117 about the borehole 102 (shown in FIG. 1B). In embodiments of the present invention, the static magnetic field generated by the principal magnet system 121 is substantially of the same strength over a region of interest. The magnitude of the generated magnetic field may vary from about 100 Gauss to about 250 Gauss at different depths of investigations in some illustrative examples. Of course, other values for the magnetic field may be present depending on the particular implementation. This field generates a net magnetization (the vector sum of individual nuclear moments) that causes relevant nuclei in the volume (e.g., photons from hydrogen) to precess about the static magnetic field. The frequency of the precession depends on the applied static magnetic field and the gyro-magnetic ratio of the nucleus, and is known as the Larmour frequency. An externally applied pulse of RF magnetic field at the Larmour frequency causes the net magnetization to tip away from its equilibrium position to a plane that is transverse to the applied static field.

According to an embodiment of the present invention, each NMR acquisition by the NMR logging tool 114 may be preceded by selective real-time adjustments of RF signals' operating parameters based on the reservoir temperatures. Thus, step 504 involves performing a temperature measurement of the magnet using the temperature sensor 124 disposed at the NMR logging tool 114 in order to accurately determine if the RF operating parameters need to be adjusted (step 506). In one embodiment, at step 506, the controller 126 may determine whether the temperature rises above a predetermined threshold or whether the measured temperature is within a certain range of temperatures.

In response to determining that an operating parameters' adjustment is needed (decision block 506, "yes" branch), at step 508, the controller 126 performs the adjustment. In various embodiments, the adjustment may be implemented in different ways.

In some cases, the NMR logging tool 114 is a multi-frequency tool. In other words, the NMR logging tool 114 may operate at multiple distinct radio frequencies over a range, and each RF may correspond to a different depth of investigation about the borehole 102. In this embodiment, step 508 may involve reducing the current in the antenna system at a higher temperature. In particular, the controller 126 may control the current source 122 connected to the antenna system 120 to send reduced electric current to the antenna system 120 configured to generate the RF magnetic field. In these illustrative examples, the current source 122 is an alternating current source. This embodiment enables the NMR logging tool 114 to switch to one or more power-save modes at higher temperatures while increasing SNR and causing minimal interference with other frequencies. Advantageously, this embodiment improves performance of the NMR logging tool 114.

In another embodiment, step 508 may involve reducing the width of the RF pulses. In particular, the controller 126 may control the PWM 135 component of the transmitter 136 to reduce the pulse widths of all pulses generated by the transmitter 136. In this embodiment RF pulse width may be modified in small steps. It should be noted that this pulse width reduction also reduces the output power. This embodiment enables the NMR logging tool 114 to switch to one or more power-save modes at higher temperatures while increasing SNR because of the wider band excitation associated with the reduced pulse width. This embodiment may be implemented in a single frequency NMR logging tool 114 where interference with other frequencies is not of concern.

In yet another embodiment, step 508 may involve adjusting frequency of the RF pulses. In particular, the controller 126 may be configured to generate pulses having a first frequency. In some embodiments, the first frequency may have been stored as the last known tuned frequency. Once the temperature variation is detected by the controller 126 of the NMR logging tool 114, the controller 126 adjusts the first frequency to a second frequency using the VFG 137 proportional to the detected temperature variation so as to at least partially adjust the position of the sensitive volume. In some embodiments, the first pulse frequency may be about 1 MHz and the second pulse frequency may be about 950 KHz when temperature changes by 150° C. In other words, in this embodiment, the controller 126 at least partially compensates for magnetic field variations caused by temperature deviations.

In general, step 508 may involve adjusting one or more of the three parameters (amplitude, pulse width and frequency) of the RF excitation to achieve the RF pulse excitation angle which maximizes the signal strength. Then, the controller 126 sets the determined optimal excitation angle for the NMR spin echo excitation. In some embodiments, each of the three parameters may be adjusted to regain $B_0$/RF $B_1$ match needed to achieve optimal NMR spin echo excitation.

In the exemplary and illustrative embodiment, the operating parameters are actively adjusted in real time before each NMR acquisition. This active adjustment can be established in a number of ways. In other embodiments, adjusting the operating parameters can include, for example, adjusting RF pulse amplitude and/or pulse width according to a corresponding predetermined temperature gradient. In yet other embodiments, the controller 126 may perform a step wise adjustment (with constant or variable step sizes), a continuous adjustment, or an adjustment made at intervals (e.g., above and/or below certain temperature thresholds). Thus, more than one threshold may exist. Adjusting RF pulse amplitude and/or pulse width may have several additional advantages. In yet another embodiment, the controller 126 may be preconfigured to adjust operating parameters based on the predetermined reservoir temperature measurements.

In one embodiment, at step 510, a spin echo imaging method based on the well-known Carr Purcell Meiboom Gill (CPMG) condition is performed. The spin echoes are detected by the receiver 134 and converted to mathematical data by the controller 126. The mathematical data resulting from the repeated measurements may be processed (using known data processing techniques) to produce (image or non-image) outputs indicative of the petrophysical properties of the formation volume of interest. As shown in FIG. 5, steps 504-510 may be repeated at each depth of investigation within the borehole 102.

Accordingly, as set forth above, the embodiments disclosed herein may be implemented in a number of ways. In general, in one aspect, the disclosed embodiments are directed to a logging instrument for estimating a property of a formation penetrated by a borehole. The instrument includes, among other things, a magnet to generate a magnetic field. The instrument also includes pulse sequencer circuitry that supplies radio frequency (RF) signals. The instrument additionally includes an antenna system configured to transmit the RF signals and to obtain nuclear magnetic resonance (NMR) measurements of the formation in response to the transmitted RF signals. In one aspect, the logging tool contains a temperature sensor configured to obtain temperature measurements of the magnet assembly described above. The instrument additionally includes a control unit communicatively coupled to the temperature sensor, the antenna system and the pulse sequencer circuitry and configured to i) receive the temperature measurements and ii) selectively adjust operating parameters of the pulse sequencer circuitry based on the received temperature measurements in order to maintain optimal intensity of the magnetic field.

In one or more embodiments, the logging instrument for estimating a property of a formation may further include any of the following features individually or any two or more of these features in combination: a) at least one magnetic core made of a soft magnetic material; (b) the control unit further configured to selectively modify electric current induced in the antenna system based on the received temperature measurements; (c) the control unit further configured to selectively modify pulse width of the RF signals based on the received temperature measurements; (d) the control unit further configured to selectively modify pulse frequency of the RF signals based on the received temperature measurements; (e) the optimal intensity magnetic field is a radio-frequency magnetic field with a pre-determined optimal excitation angle of the RF signals; and (f) the control unit further configured to adjust the operating parameters of the pulse sequencer circuitry or the electric current induced in the antenna system step-wise with constant or variable step sizes when the temperature falls into a predetermined temperature range.

In general, in yet another aspect, the disclosed embodiments are related to a method for determining a parameter of interest of a volume of earth formation with a logging instrument conveyed in a borehole within the formation. The method includes, among other steps, the steps of i) transmitting, using an antenna system disposed in the logging instrument, RF signals at measuring frequencies to produce a static magnetic field having substantially the same field strength in the volume of the formation; ii) measuring, using a temperature sensor disposed in the logging instrument, temperature of a magnet disposed in the logging instrument; iii) selectively adjusting, using a control unit, the operating parameters of the RF signals based on the measured temperature; and iv) measuring, using the logging instrument, the parameter of interest by obtaining nuclear magnetic resonance (NMR) measurements.

In one or more embodiments, the method for determining a parameter of interest of a volume of earth formation with a logging instrument may further include any one of the following features individually or any two or more of these features in combination: (a) the step of selectively adjusting the operating parameters further comprising selectively modifying, using the control unit, electric current induced in the antenna system based on the received temperature measurements; (b) the step of selectively adjusting the operating parameters further comprising selectively modifying, using the control unit, pulse width of the RF signals based on the received temperature measurements; (c) the step of selectively adjusting the operating parameters further comprising selectively modifying, using the control unit, pulse frequency of the RF signals based on the received temperature measurements; and (d) adjusting the operating parameters of the pulse sequencer circuitry or the electric current induced in the antenna system in a step-wise manner with constant or variable step sizes when the temperature falls into a predetermined temperature range.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. A logging instrument for estimating a property of a formation penetrated by a borehole, the instrument comprising:
   a magnet disposed at the instrument to generate a magnetic field;
   pulse sequencer circuitry that supplies radio frequency (RF) signals;
   an antenna system configured to transmit the supplied RF signals and configured to obtain nuclear magnetic resonance (NMR) measurements of the formation in response to the transmitted RF signals;
   a temperature sensor configured to obtain temperature measurements of the magnet; and
   a control unit communicatively coupled to the temperature sensor, the antenna system and the pulse sequencer circuitry, the control unit configured to receive the temperature measurements periodically transmitted by the temperature sensor and configured to selectively adjust operating parameters of the pulse sequencer circuitry based on the received temperature measurements in order to maintain optimal intensity of the magnetic field;

wherein the control unit is further configured to selectively modify electric current induced in the antenna system based on the received temperature measurements or selectively modify pulse width of the RF signals based on the received temperature measurements, or selectively modify both electric current and pulse width based on the received temperature measurement.

2. The instrument as recited in claim 1, the instrument further comprising at least one magnetic core disposed at the instrument, the at least one magnetic core made of a soft magnetic material.

3. The instrument as recited in claim 1, wherein the control unit configured to selectively adjust operating parameters of the pulse sequencer circuitry is further configured to selectively modify pulse frequency of the RF signals based on the received temperature measurements.

4. The instrument as recited in claim 1, wherein the control unit is further configured to selectively modify electric current induced in the antenna system, pulse width of the RF signals and pulse frequency of the RF signals based on the received temperature measurements in order to maintain optimal intensity of the magnetic field.

5. The instrument as recited in claim 1, wherein the optimal intensity magnetic field comprises a radio-frequency magnetic field with a pre-determined optimal excitation angle of the RF signals.

6. The instrument as recited in claim 1, wherein the operating parameters of the pulse sequencer circuitry or the electric current induced in the antenna system are adjusted step-wise with constant or variable step sizes when the temperature falls into a predetermined temperature range.

7. A method for determining a parameter of interest of a volume of earth formation with a logging instrument conveyed in a borehole within the formation, the method comprising:

transmitting, using an antenna system disposed in the logging instrument, RF signals at measuring frequencies to produce a static magnetic field having substantially the same field strength in the volume of the formation;

measuring, using a temperature sensor disposed in the logging instrument, temperature of a magnet disposed at the logging instrument;

selectively adjusting, using a control unit, the operating parameters of the RF signals based on the measured temperature; and measuring, using the logging instrument, the parameter of interest by obtaining nuclear magnetic resonance (NMR) measurements;

wherein selectively adjusting the operating parameters of the RF signals includes selectively modifying electric current induced in the antenna system based on the received temperature measurements or selectively modifying pulse width of the RF signals based on the received temperature measurements, or selectively modifying both electric current and pulse width based on the received temperature measurement, using the control unit.

8. The method as recited in claim 7, wherein selectively adjusting the operating parameters of the transmitted RF signals further comprises selectively modifying, using the control unit, pulse frequency of the RF signals based on the received temperature measurements.

9. The method as recited in claim 7, wherein selectively adjusting the operating parameters of the transmitted RF signals is performed in order to maintain optimal intensity of the magnetic field.

10. The method as recited in claim 7, wherein the operating parameters of the pulse sequencer circuitry or the electric current induced in the antenna system are adjusted step-wise with constant or variable step sizes when the temperature falls into a predetermined temperature range.

11. The method as recited in claim 7, wherein the temperature sensor comprises a configuration register, and wherein measuring, using the temperature sensor, the temperature of the magnet further comprises configuring the temperature sensor using the control unit.

12. The method as recited in claim 7, wherein measuring the parameter of interest by obtaining nuclear magnetic resonance (NMR) measurements further comprises receiving an RF detection signal from the antenna system and digitizing the received RF detection signal.

13. An information processing system for determining a parameter of interest of a volume of earth formation with a logging instrument conveyed in a borehole within the formation, the information processing system comprising a processor and a memory device coupled to the processor, the memory device containing a set of instructions that, when executed by the processor, cause the processor to:

transmit RF signals at measuring frequencies to produce a static magnetic field having substantially the same field strength in a volume of the formation;

measure temperature of a magnet disposed at a logging instrument;

selectively adjust operating parameters of the RF signals based on the measured temperature; and measure parameter of interest by obtaining nuclear magnetic resonance (NMR) measurements;

wherein the set of instructions that cause the processor to selectively adjust the operating parameters of the transmitted RF signals causes the processor to selectively modify electric current induced in the antenna system based on the received temperature measurements or selectively modify pulse width of the RF signals based on the received temperature measurements, or selectively modify both electric current and pulse width based on the received temperature measurements.

14. The information processing system of claim 13, wherein the set of instructions that cause the processor to selectively adjust the operating parameters of the transmitted RF signals further cause the processor to selectively modify pulse frequency of the RF signals based on the received temperature measurements.

* * * * *